(12) United States Patent
Tantoush

(10) Patent No.: US 6,313,994 B1
(45) Date of Patent: Nov. 6, 2001

(54) EXTENDED SURFACE AREA HEAT SINK

(75) Inventor: Mohammed A. Tantoush, Union City, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/625,067

(22) Filed: Jul. 25, 2000

(51) Int. Cl.[7] ................................................. H05K 7/20
(52) U.S. Cl. ..................... 361/704; 361/700; 361/709; 361/710; 361/719; 361/720; 257/706; 257/714; 257/715; 257/717; 165/80.3; 165/80.4; 165/185; 174/15.2; 174/16.3
(58) Field of Search ........................... 361/688, 687, 361/689, 698–700, 704, 707, 709, 714, 715, 719–721; 257/707, 706, 713–719; 165/80.2–80.4, 185; 174/15.1, 15.2, 16.3

(56) References Cited

U.S. PATENT DOCUMENTS

| | | | |
|---|---|---|---|
| 5,751,063 | * 5/1998 | Baba | ................ 257/723 |
| 5,930,115 | * 7/1999 | Tracy et al. | ................ 361/704 |
| 5,946,188 | * 8/1999 | Rochel et al. | ................ 361/690 |
| 6,101,093 | * 8/2000 | Wong et al. | ................ 361/709 |
| 6,125,037 | * 9/2000 | Bollesen | ................ 361/704 |
| 6,141,220 | * 10/2000 | Lin | ................ 361/704 |
| 6,163,073 | * 12/2000 | Patel | ................ 257/712 |

* cited by examiner

Primary Examiner—Leo P. Picard
Assistant Examiner—Boris L. Chervinsky
(74) Attorney, Agent, or Firm—Conley, Rose & Tayon, P.C.

(57) ABSTRACT

A heat sink for cooling a high power consumption device, such as a central processing unit (device), has extended heat transfer areas. In an embodiment, the extended heat transfer areas may include fins protruding from portions of a heat sink base. The extended heat transfer area of the heat sink may overhang an area of a circuit board adjacent to the high power consumption device. Low power consumption components, such as memory chips, can be mounted on the circuit board in close proximity to the high power consumption device and beneath the heat sink. The low power consumption component may have separate heat sinks that attach to the low power consumption components and extend beyond the base of the high power consumption device heat sink.

21 Claims, 5 Drawing Sheets

EXTENDED SURFACE AREA HEAT SINK

BACKGROUND OF THE INVENTION

1. Field of the Invention

This invention generally relates to heat sinks for computer systems, and more particularly to a heat sink for a high energy consumption device, such as a central processing unit, which may be placed in close proximity to low power consumption components, such as memory chips.

2. Description of the Related Art

Computer systems such as workstations, personal computers, and portable computers may include components housed within an enclosure. Some components, such as central processing unit (devices) and memory chips, typically mount on circuit boards within the enclosure. Other components, such as circuit boards and disk drives, typically mount to a chassis of the computer system.

Only a limited amount of space exists within a computer enclosure. Computer systems may be designed to make the best use of the available space. Computer components need to be in close proximity to each other so that the best performance from the computer components may be obtained. However, having computer components in close proximity to each other may be problematic due to geometry and heat generation factors within the computer enclosure.

A computer component may function properly only when an operating temperature of the component is at or below a maximum operating temperature. In some instances, a package surface area of a component is too small to permit sufficient heat transfer from the package to keep the component at or below maximum operating temperatures using natural convection. Such a component requires additional cooling. If the temperature of a computer component exceeds the maximum operating temperature of the component, or if the temperature within the computer enclosure exceeds a maximum operating temperature, a reduction of computer performance may occur. Eventually, the components of the computer system may be permanently damaged or destroyed if the computer components or the computer system are operated at too hot a temperature.

Some computer components may be high power consumption devices. High power consumption devices typically generate large amounts of heat during use. Generally, high power consumption devices require cooling to function properly. The cooling of a high power consumption device may be accomplished by attaching a heat sink to the high power consumption device. The high power consumption device transfers heat to the heat sink, and the heat sink transfers the heat to the surroundings. One type of heat sink provides a thermal connection between a heat transfer surface of the high power consumption device and a convection cooled surface area of the heat sink. A cooling fan, or cooling fans, within the computer enclosure may provide forced convection to transfer heat from the heat sink to the surroundings if natural convection within the computer enclosure does not provide enough heat transfer to the surroundings. It is desirable to provide a heat sink for a high power consumption device that has a large heat transfer surface area. The heat sink should allow the device to operate at as low a temperature as possible.

One type of heat sink for a high power consumption device includes a base having a plurality of fins extending from an upper surface of the base. The base has a lower surface that generally corresponds to the principal heat transfer surface of the high power consumption device. The upper surface of the base typically has the same shape as the lower surface of the base. The fins provide extended heat transfer surface area for the heat sink.

Another type of heat sink for a high power consumption device is shown in U.S. Pat. No. 5,412,535, issued to Chao et al, and is incorporated by reference as if fully set forth herein. The heat sink comprises a base with a vertically mounted heat pipe connected to the base. The lower surface of the base thermally contacts the heat transfer surface of the high power consumption device. Horizontal fins extend from the heat pipe to increase the heat transfer surface area of the heat sink.

Some computer components, such as a collection of static random access memory (SRAM) units, may be low power consumption components. Low power consumption components may require heat sinks to keep the components functioning properly. A heat sink for a low power consumption component may be required if the component generates excessive heat during use, or if the component is placed near a high power consumption device. Individual heat sinks may be provided for individual low power consumption components, or one heat sink may be used to cool several low power consumption components.

SUMMARY OF THE INVENTION

A finned heat sink for a high power consumption device includes extended heat transfer surface area that overhangs portions of a circuit board adjacent to the high power consumption device. Low power consumption components may be mounted in close proximity to the high power consumption device. A portion of the heat sink may extend over the low power consumption components. Sufficient room may exist between overhanging portions of the heat sink and the low power consumption components to allow an optional heat sink or a plurality of optional heat sinks to be attached to the low power consumption components.

The heat sink for the high power consumption device may require the addition of a high thermal conductivity material to a portion of the heat sink that contacts a heat transfer surface of the high power consumption device. The high thermal conductivity material may help to spread heat transferred from the high power consumption device throughout the heat sink. The high thermal conductivity material may absorb high heat flux generated by the high power consumption device. The high thermal conductivity material may spread the heat flux throughout the finned heat sink to promote efficient heat transfer from fins of the heat sink to the surroundings. The high thermal conductivity material may be a metal, such as copper or a copper alloy, and/or the high thermal conductivity material may include a heat pipe or heat pipes. A heat pipe may be a vapor chamber plate type of heat pipe. A heat pipe may be mounted or interleaved in a surface of the extended area heat sink. A heat pipe or a surface of the extended area heat sink immediately adjacent to the heat pipe may be placed in thermal contact with the high power consumption device.

An extended area heat sink for a high power consumption device may allow the components of a computer system to be placed close together within a computer enclosure. Placing the components of a computer system close together may allow the computer enclosure to be small. Close placement of the computer components and devices may allow for improved performance of a computer system. Because the heat sink for the high power consumption device has extra heat transfer surface area, cooling fans within the computer system may be operated at lower speeds while still providing sufficient system cooling. Operating system fans at low speeds may reduce acoustic noise generated by the computer system. Operating the system fans at low speeds may also extend the life of the fans.

An advantage of an extended area heat sink is that the heat sink may allow the development of faster and more efficient electronic devices. Components of a system may be located adjacent to a high power consumption device that generates a large amount of heat. The heat generated by the high power consumption device may be dissipated by the extended area heat sink. The close proximity of components to the high power device may allow for more efficient, faster, and smaller electronic systems.

Another advantage of an extended area heat sink is that the heat sink may allow for a reduction in noise generated by a system. The extended area heat sink may allow system fans to run at low speeds so that the overall noise generated by a system is reduced. Running a fan at a low fan speed may help to extend the life of the fan. A low fan speed may also help to ensure that the system meets environmental regulatory requirements. An extended area heat sink may also be sturdy, durable, light weight, simple, efficient, reliable and inexpensive; yet the heat sink may also be easy to manufacture, install, maintain and use.

Figure 1:
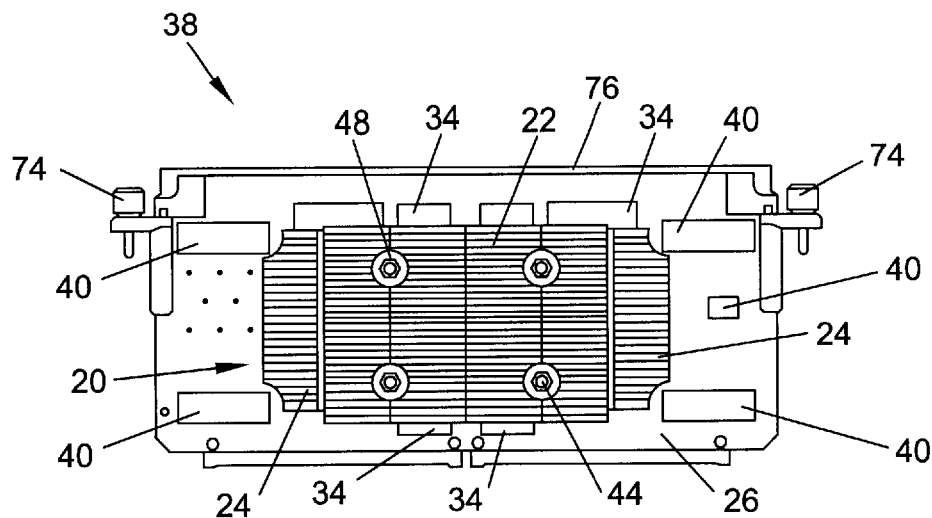
FIG. 1 is a top elevational view of a device module.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
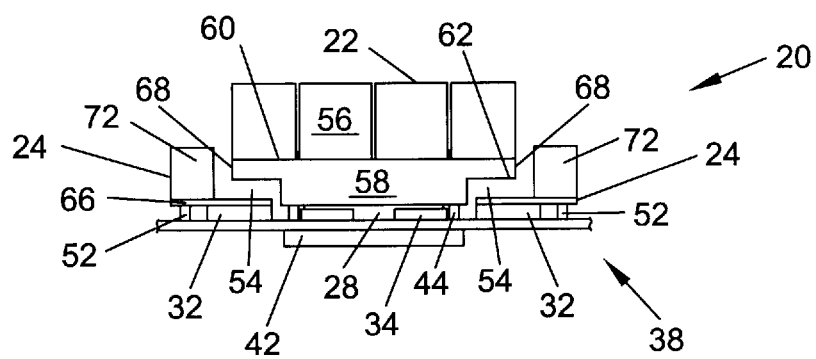
FIG. 2 is a partial front elevational view of the device module.
Figure 3:
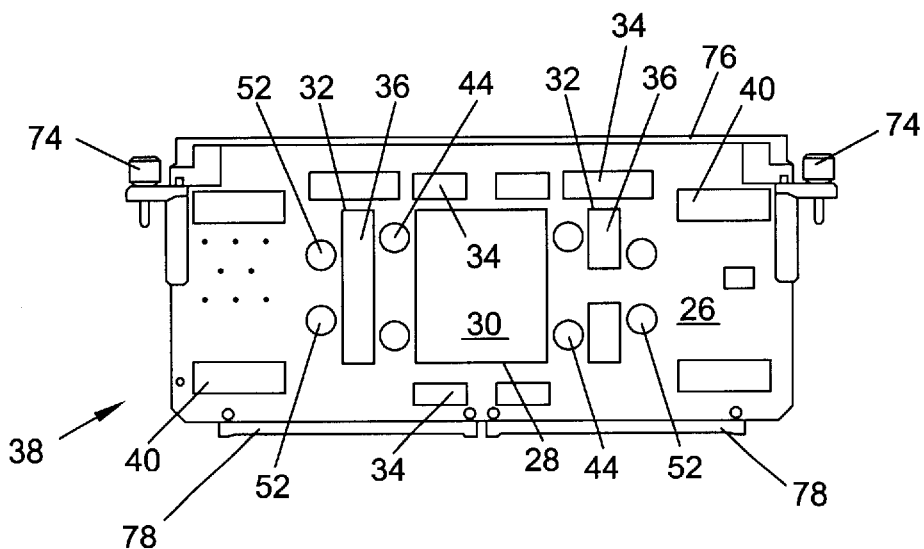
FIG. 3 is a top elevational view of the device module with the heat sinks removed.
Figure 4:
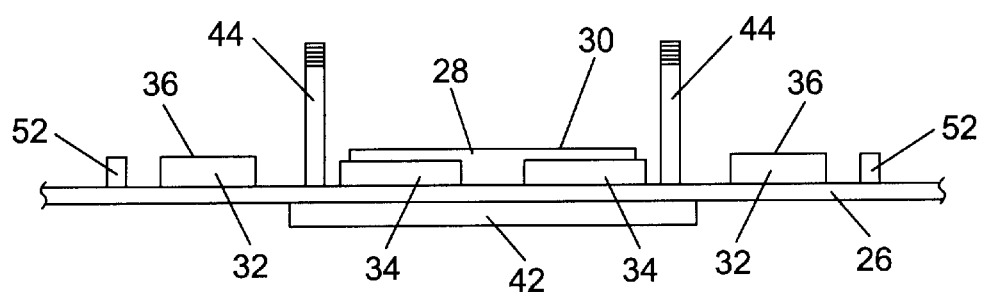
FIG. 4 is a partial front elevational view of the device module with the heat sinks removed.

With reference to the drawings, and particularly to FIGS. 1 and 2, a heat sink system is designated generally as 20. The heat sink system 20 may include device heat sink 22 and component heat sinks 24. FIGS. 3 and 4 show circuit board 26 without the heat sink 22 and without the component heat sinks 24 to show the components located beneath the heat sinks. The heat sink 22 may be used to cool a high power consumption device 28, such as central processing unit (device). The device 28 may be a part of a computer system. Upper surface 30 of the device 28 is a heat transfer surface for the device. Component heat sinks 24 may cool components 32 that are located in close proximity to the device 28. Some components 34 located in close proximity to the device 28 may not require a heat sink 24. The upper surfaces 36 of the components 32 may be heat transfer surfaces. Various methods and systems exist for attaching computer components and devices to a circuit board. Such systems and methods are well known in the art and are not described herein.

Figure 5:
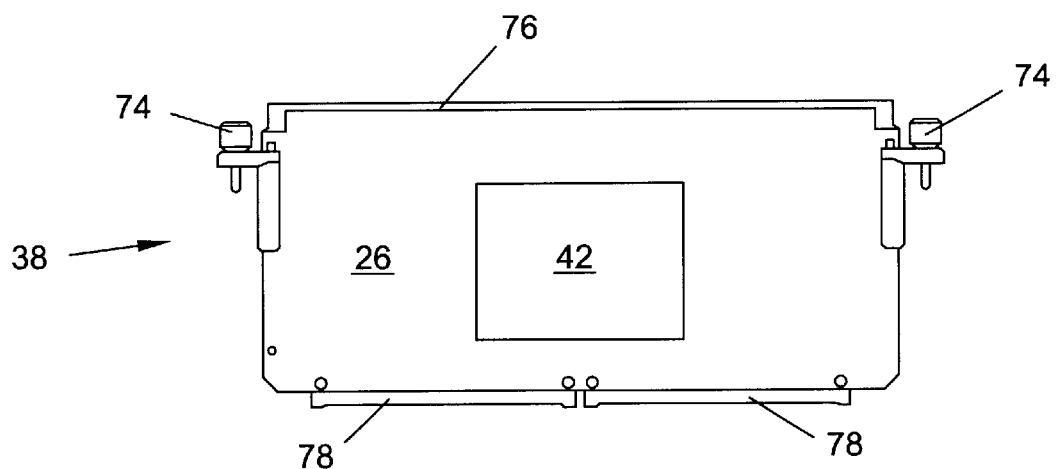
FIG. 5 is a bottom view of the device module.

As shown in FIGS. 1, 2, and 3, device module 38 may include a circuit board 26, device 28, heat sink 22, components 32 in close proximity to the device, component heat sinks 24, and other computer components 40. FIG. 5 shows a bottom view of a device module 38. Bolster plate 42 may support heat sink 22. The bolster plate 42 may have threaded posts 44 that extend through circuit board 26, and through holes 46 in the heat sink 22 (holes 46 shown in FIGS. 7 and 8). Fasteners 48 (shown in FIG. 1) may connect to the posts 44 to secure the heat sink 22 to the circuit board 26. Securing the heat sink 22 to the circuit board 26 thermally connects surface 50 of the heat sink to the heat transfer surface 30 of the device 28. The heat sink surface 50 has a perimeter. The perimeter of the surface 50 may generally correspond to the perimeter of the heat transfer surface 30 of the device 28.

Heat sink 22 may be supported by the device 28, the bolster plate 42, and the posts 44. Component heat sinks 24 may be supported by the components 32, and by posts 52 extending from the circuit board 26, as shown in FIG. 2.

A portion of heat sink 22 may extend over component heat sinks 24 and components 34. The heat sink 22 may be inhibited from contacting the component heat sinks 24 and components 34. Air gaps 54 may exist between the heat sink 22 and the component heat sinks 24 and components 34. An air gap 54 may help to thermally isolate the component heat sinks 24 and components 34 from the heat sink 22.

Figure 6:
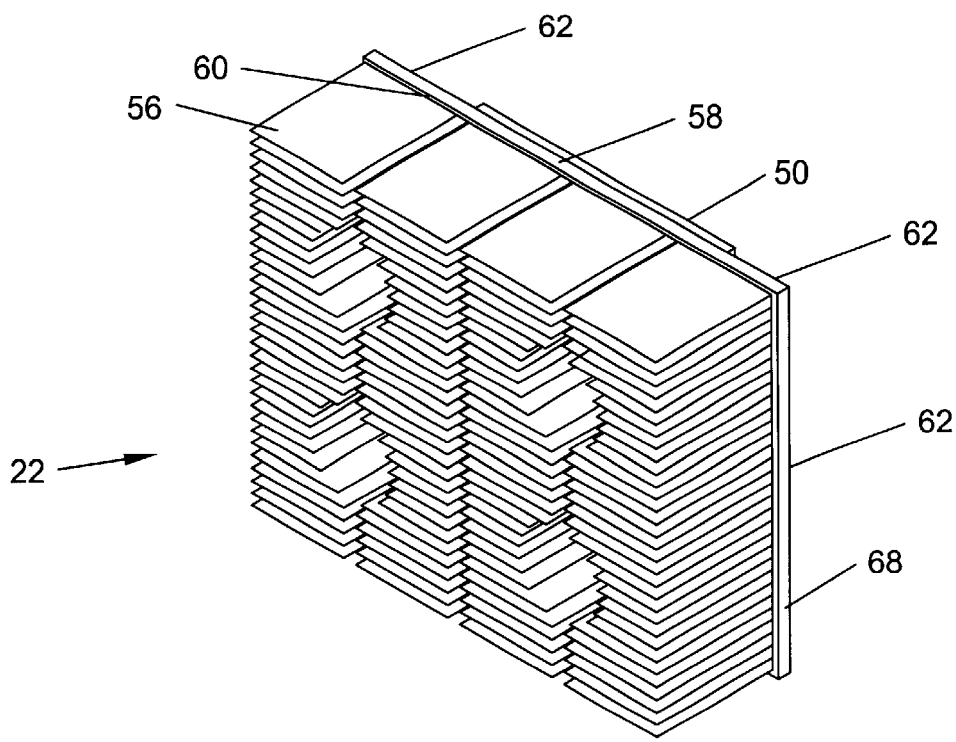
FIG. 6 is a perspective view of an extended area heat sink.

FIG. 6 shows a perspective view of an embodiment of a heat sink 22. The heat sink 22 may have fins 56 and base 58. The fins 56 may extend from upper surface 60 of the base 58. The fins 56 may provide extra heat transfer surface area for dissipation of heat. The base 58 may have thermal contact surface 50 located on lower surface of the base. The thermal contact surface 50 may thermally connect the heat sink 22 to a heat transfer surface 30 of the device 28. The base 58 may also have extensions 62. Extensions 62 extend beyond the perimeter of the heat sink contact surface 50. When the heat sink 22 is mounted to a circuit board 26, the extensions 62 may overhang sections of the circuit board adjacent to the device 28. Portions of the extensions 62 may extend over and above portions of the components 32, as shown in FIG. 2. The extensions 62 may extend beyond the perimeter of the heat sink contact surface 50 greater than approximately ¼ of an inch from an edge of the contact surface. The extensions 62 may extend beyond each edge of the contact surface 50. Alternatively, the extensions 62 may extend beyond only selected edges of the contact surface 50.

Figure 7:
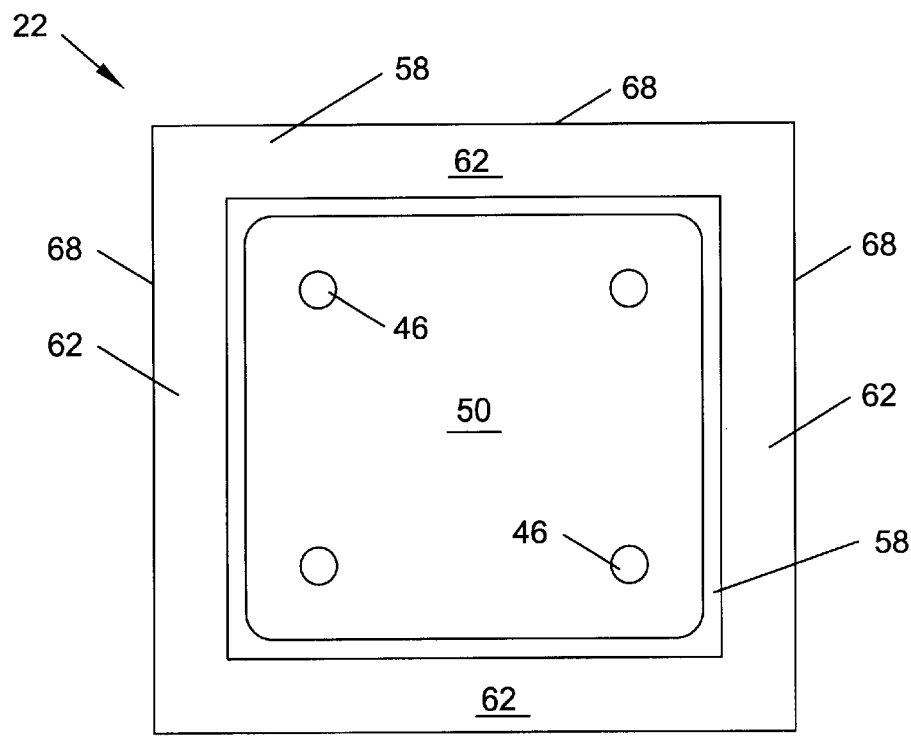
FIG. 7 is a bottom elevational view of the extended area heat sink shown in FIG. 6.
Figure 8:
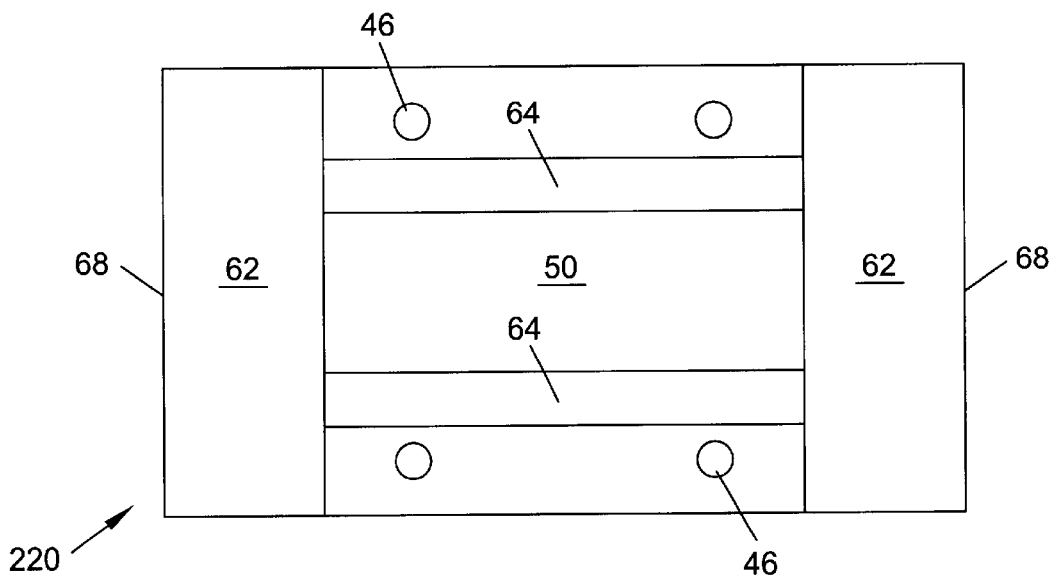
FIG. 8 is a bottom elevational view of an alternative embodiment of the extended area heat sink.

The base 58 and fins 56 of the heat sink 22 may be made of a lightweight, high thermal conductivity metal. The lightweight metal may minimize the mass of the heat sink 22. The high thermal conductivity of the metal may promote heat transfer. A preferable metal is aluminum or an aluminum alloy. Because the heat sink 22 has extensions 62 which extend beyond the heat sink contact surface 50, a portion of the contact surface may be made of a metal with a higher thermal conductivity than the lightweight, high thermal conductivity metal used to form the base 58. The higher thermal conductivity metal may help spread heat transferred from the device 28 throughout the heat sink 22. FIG. 7 shows a bottom view of the heat sink 22 wherein the contact surface 50 is a copper plate. The extensions 62 may be located on each side of the contact surface 50, or only on selected sides of the contact surface. FIG. 8 shows a bottom view of an alternate embodiment of a heat sink 220. The contact surface 50 of the heat sink 220 includes high thermal conductivity heat pipes 64. A heat pipe 64 may be a vapor chamber plate heat pipe, or another type of heat pipe. Heat pipes 64 may help to spread heat transferred from the device 28 throughout the heat sink 22.

The heat sink 22 shown in FIG. 8 has only two extensions 62 adjacent to the contact surface 50. A heat sink 22 may have from one to four extensions 62. The extensions 62 may be irregularly shaped to avoid obstacles positioned on a circuit board 26. For example, an extension 62 may have a half circle cut-out located adjacent to an edge of the extension. The cutout may allow the heat sink 22 to be positioned near a post or device that extends from the circuit board 26.

Figure 9:
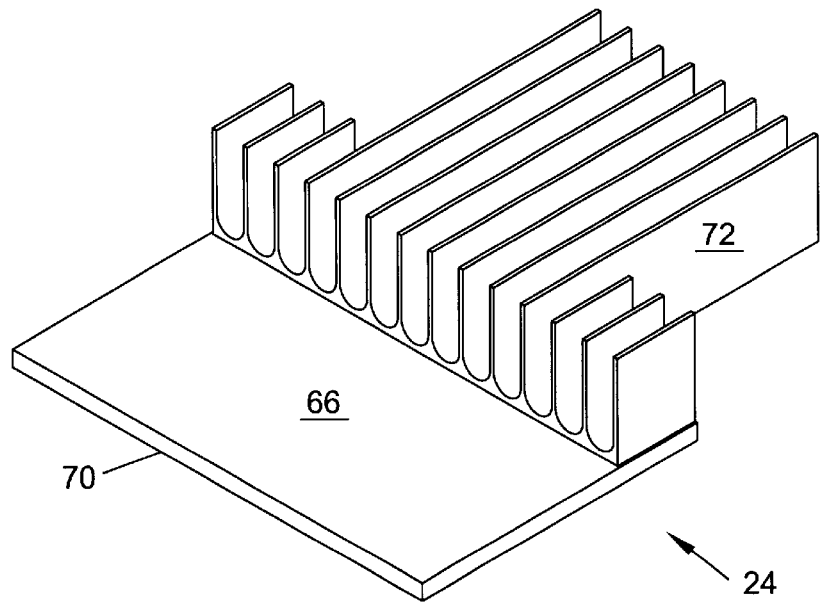
FIG. 9 is a perspective view of a low power consumption heat sink.

FIG. 9 shows a perspective view of a component heat sink 24. The heat sink 24 may include a base 66. As shown in FIG. 2, a portion of the base 66 may extend beyond edge 68 of the heat sink extensions 62 when the device module 38 is assembled. Thermal contact surface 70 of the base 66 may contact the component heat transfer surface 36. A portion of the base 66 that extends beyond the heat sink extensions 62 may have protruding fins 72. The fins 72 may provide extended surface area for the heat sink 24. The heat sink base 66 may be made of a high thermal conductivity material such as copper, copper alloys, aluminum, or aluminum alloys. A heat sink 24 may be formed for each individual component 32, or one heat sink may serve as a heat sink for several components. Heat sinks 24 may have shapes designed to avoid contact with nearby computer components 40.

Figure 10:
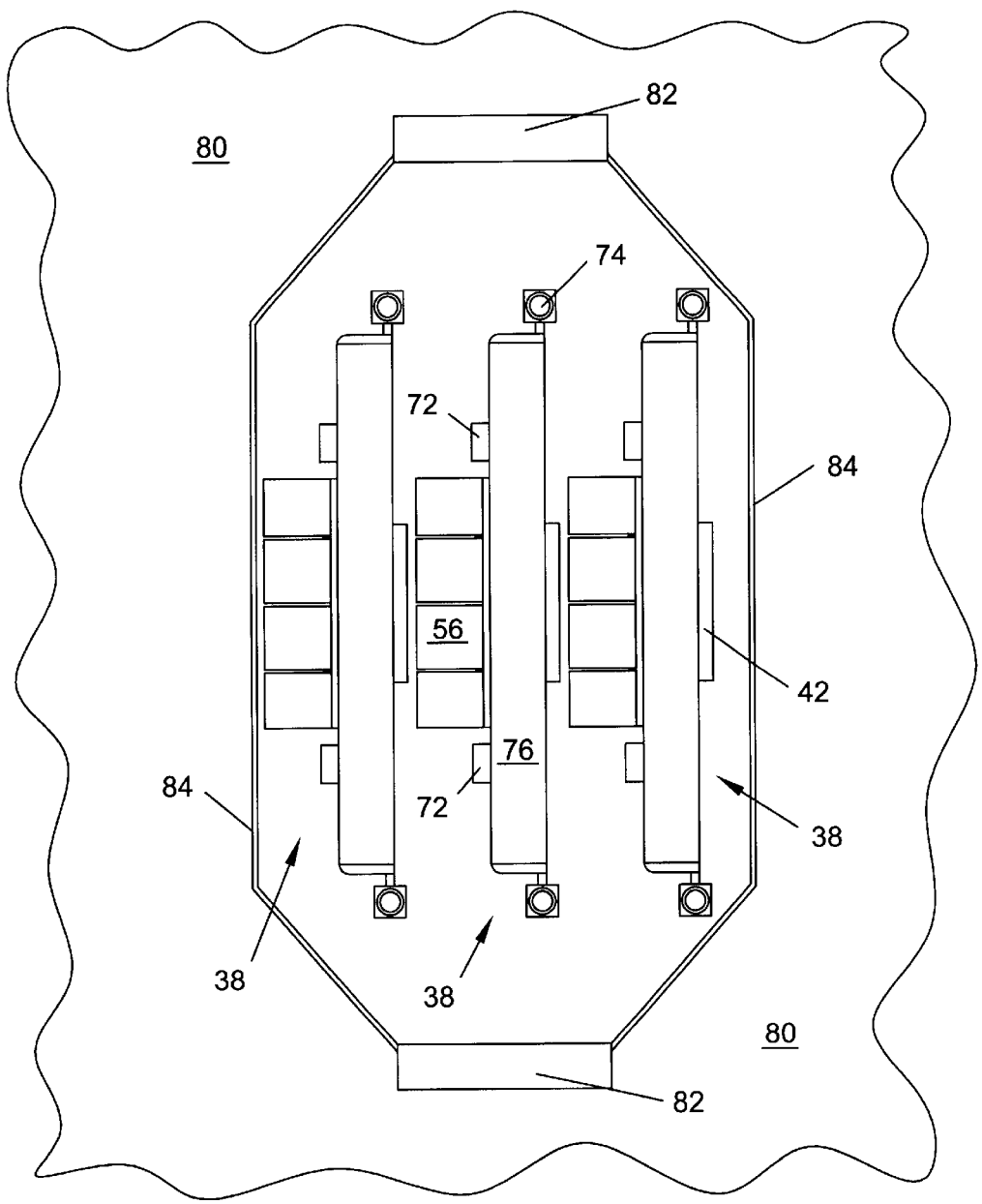
FIG. 10 is a top elevational view of a circuit board having multiple device modules.

A device module 38 may optionally include mounting fasteners 74, upper plate 76, and contacts 78. The contacts 78 may allow the device module 38 to be electrically coupled to another circuit board 80. Multiple device modules 38 may be located in close vertical or horizontal proximity to each other. FIG. 10 shows an embodiment of three device modules 38 coupled to a circuit board 80. Fans 82 may provide forced convection cooling of the device modules 38. Fan shrouds 84 may be attached to the fans 82 to direct air flow produced by the fans.

A high energy consumption device 28, such as a CPU, may be mounted to a circuit board 26 or to other support structure. Component devices 32 may be mounted to the circuit board 26 in close proximity to the device 28. To form a heat sink system 20, component heat sinks 24 may be attached to selected components 32 adjacent to the device 28. A thermally conductive paste or glue may be placed between a heat transfer surface 70 of the component heat sink 24 and the component heat transfer surfaces 36. In alternate embodiments, component heat sinks 24 may be attached directly to the components 32, to posts 52 extending from the circuit board 26, or the component heat sinks may be attached by any other method that establishes good thermal contact between the component heat sinks and the selected components. Some components 34 that are in close proximity to the device 28 may not require component heat sinks 24.

After the component heat sinks 24 are placed in thermal contact with components 32 that require additional cooling, a heat sink 22 may be placed on the device 28. Air gaps 54 may exist between the heat sink 22 and the component heat sinks 24 and/or the components 34. Heat transfer surface 30 of the device 28 may be placed in direct thermal contact with the heat transfer surface 50 of the heat sink 22. In an embodiment, a high thermal conductivity paste or thermal glue may be placed between heat transfer surface 30 of the device 28 and the heat transfer surface 50 of the heat sink 22. The device 28 may be coupled to the circuit board by a bolster plate 42, bolster plate posts 44, and fasteners 48. Alternatively, another system for fastening a heat sink 22 to a device 28 may be used. After installing the device 28, remaining components and devices of a system may be coupled together to form a system. The remaining components and devices may include a fan or fans for forced convection cooling of the system. The system may be connected to a power supply.

When power is supplied to the system, the high energy consumption device 28 may dissipate heat. Some of the heat dissipated by the device 28 may be transferred to the heat sink 22. The heat sink 22 may transfer heat to the surroundings by natural convection, or by forced convection if the system includes a cooling fan or cooling fans. The air gaps 54 between the heat sink 22 and the component heat sinks 24 and/or components 34 may inhibit the component heat sinks and/or the components from being heated by the device 28 and the heat sink 22. Heat dissipated by the selected components 32 may be transferred to the component heat sinks 24. The component heat sinks 24 may dissipate heat to the surroundings by convection, or by forced convection if the system includes cooling fans.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A heat sink system for a computer system, comprising:
   a device coupled to a circuit board, the device having a heat transfer surface; a component coupled to the circuit board, the component having a heat transfer surface;
   a first heat sink comprising a base and a plurality of fins, wherein a first portion of the first heat sink base thermally contacts the heat transfer surface of the device, and a second portion of the first heat sink base extends over a portion of the component; and
   a second heat sink comprising a base and a plurality of fins, wherein a first portion of the second heat sink base thermally contacts a heat transfer surface of the component, and a second portion of the second heat sink base extends beyond an edge of the first heat sink.

2. The heat sink system as defined in claim 1, further comprising a high thermal conductivity material between the device and the first heat sink.

3. The heat sink system as defined in claim 1, wherein the first portion comprises a high thermal conductivity material.

4. The heat sink system as defined in claim 3, wherein the high thermal conductivity material comprises a copper plate.

5. The heat sink system as defined in claim 3, wherein the high thermal conductivity material comprises a heat pipe.

6. The heat sink system as defined in claim 1, wherein the device comprises a central processing unit.

7. The heat sink system as defined in claim 1, wherein the component comprises a static random access memory chip.

8. A method of providing a heat sink system for a device and component mounted on a circuit board of a computer system, the method comprising:

thermally connecting a thermal contact surface of a first heat sink to a heat transfer surface of the device, wherein a portion of the first heat sink extends past an edge of the thermal contact surface such that the portion of the first heat sink extends over an area of the circuit board adjacent to the device and over at least a portion of the component; and thermally connecting a thermal contact surface of a second heat sink to a heat transfer surface of the component, wherein a portion of the second heat sink extends beyond an edge of the first heat sink.

9. The method as defined in claim 8, further comprising providing a high thermal conductivity material at an interface between the first heat sink and the heat transfer surface of the device.

10. The method as defined in claim 9, wherein the high thermal conductivity material comprises a copper plate.

11. The method as defined in claim 9, wherein the high thermal conductivity material comprises a heat pipe.

12. The method as defined in claim 8, further comprising providing a high thermal conductivity material at an interface between the second heat sink and the heat transfer surface of the component.

13. The method as defined in claim 12, wherein the high thermal conductivity material comprises a copper plate.

14. The method as defined in claim 12, wherein the high thermal conductivity material comprises a heat pipe.

15. A heat sink system for a computer system, comprising:

a device coupled to a circuit board, the device having a heat transfer surface;

a component coupled to the circuit board, the component having a heat transfer surface;

a first heat sink comprising:

a base comprising:

a first portion thermally contacting the heat transfer surface of the device; and a second portion extending over a portion of the component; and a plurality of fins extending from the first heat sink base; and a second heat sink comprising:

a base comprising:

a first portion thermally contacting the heat transfer surface of the component; and a second portion extending beyond the second portion of the first heat sink;

a plurality of fins extending from the second heat sink base; and a second plurality of fins protruding from the second portion of the second heat sink base.

16. The heat sink system as defined in claim 15, further comprising a high thermal conductivity material between the device and the first heat sink.

17. The heat sink system as defined in claim 15, wherein the first portion comprises a high thermal conductivity material.

18. The heat sink system as defined in claim 17, wherein the high thermal conductivity material comprises a copper plate.

19. The heat sink system as defined in claim 17, wherein the high thermal conductivity material comprises a heat pipe.

20. The heat sink system as defined in claim 15, wherein the device comprises a central processing unit.

21. The heat sink system as defined in claim 15, wherein the component comprises a static random access memory chip.

* * * * *